US005510782A

United States Patent [19]

Norris et al.

[11] Patent Number: 5,510,782

[45] Date of Patent: Apr. 23, 1996

[54] BACK LIT KEYPAD

[75] Inventors: Jeffrey J. Norris, Bloomington; Edward J. Herout, Glencoe; Phillip R. Russell, Plymouth, all of Minn.

[73] Assignee: ITT Corporation, New York, N.Y.

[21] Appl. No.: 924,274

[22] Filed: Aug. 3, 1992

[51] Int. Cl.[6] .................... H03K 17/94

[52] U.S. Cl. .................... 341/22; 200/314

[58] Field of Search .................... 200/308, 309, 200/310, 311, 312, 313, 314, 315, 316, 317, 341, 345, 517, 302.2, 520; 425/346, 127, 129.1, 572, 573, 588; 341/22

[56] References Cited

U.S. PATENT DOCUMENTS

| | | | |
|---|---|---|---|
| 2,602,036 | 7/1952 | Sullivan | 264/139 |
| 3,031,722 | 5/1962 | Gits | 264/246 |
| 3,144,643 | 8/1964 | Anderson | 200/314 X |
| 3,441,641 | 4/1969 | Roberts | 425/573 X |
| 4,155,972 | 5/1979 | Hauser et al. | 264/250 |
| 4,163,138 | 7/1979 | Harden | 200/310 |
| 4,163,883 | 8/1979 | Boulanger | 200/314 |
| 4,293,182 | 10/1981 | Schwartz | 439/736 X |
| 4,391,764 | 7/1983 | Edinger et al. | 264/25 |
| 4,460,534 | 7/1984 | Boehm et al. | 264/246 |
| 4,654,290 | 3/1987 | Spanjer | 430/138 |
| 4,683,359 | 7/1987 | Wojtanek | 200/314 |
| 4,710,330 | 12/1987 | Lewandowski et al. | 264/25 |
| 5,011,728 | 4/1991 | Imae et al. | 200/302.2 X |
| 5,040,479 | 8/1991 | Thrash | 116/279 |
| 5,120,920 | 6/1992 | Moriike | 200/341 |
| 5,234,744 | 8/1993 | Kenmochi | 200/314 X |

FOREIGN PATENT DOCUMENTS

| | | | |
|---|---|---|---|
| 404067521 | 3/1992 | Japan | 200/345 |

*Primary Examiner*—Thomas Mullen
*Attorney, Agent, or Firm*—Freilich Hornbaker Rosen

[57] ABSTRACT

A back lit keypad device and method for fabricating it are described, which facilitates construction of a low cost, durable, and attractive keypad of the "reverse graphics illumination" type (which is opaque everywhere except for illuminated characters at the tops of the keys). The keypad device includes a shell (30, FIG. 2 ) of opaque rubber having a thin top wall (32), and an insert (42) of light-transmitting rubber molded into the cavity formed within the shell. The thin top wall of the shell has an opening therein forming a character, so light passing up through the insert can pass through the character-forming opening. The keypad device is formed by first forming the shell between first and second molds (94,110, FIG. 4 ), and leaving the formed shell in the first mold. Then a third mold (140, FIG. 5 ) is clamped against the first mold which has the shell (30) therein, and the light-passing insert material (144) is injected into the space between the shell and third mold to form the insert.

10 Claims, 1 Drawing Sheet

BACK LIT KEYPAD

BACKGROUND OF THE INVENTION

One type of backlit keyboard is fabricated by molding a keypad device, including the keys and pad thereof, of light-transmitting rubber. An opaque character is formed on the top of each key by an opaque ink or the like. Another type of backlit keypad device passes light only through character-forming openings at the top of the keys, this second type being referred to as "reverse graphics illumination". Applicant has attempted to construct such second type of backlit keypad, or keypad device, by molding it of translucent silicone rubber and coating the entire upper surface of the device with opaque ink, except for the areas that form the characters. However, such attempts did not provide acceptable blockage of light in the areas intended to be opaque. A keypad device and fabricating method therefor, which resulted in all of the device being highly opaque, except for light-transmitting areas representing characters, which was durable and could be constructed at moderate cost, would be of considerable value.

SUMMARY OF THE INVENTION

In accordance with one embodiment of the present invention, a backlit keypad device and fabricating method and apparatus therefore are provided, which results in a backlit keypad device of high quality and durability and which can be constructed at moderate cost. The keypad device includes one or more separate key portions or keys that each includes a shell of elastomeric material having top and side walls and forming a cavity therewithin. Each key also includes an insert of light-transmitting material lying in the cavity, with the top of the insert supporting the top wall of the shell. Openings are formed in the top wall of the shell, so light passing upwardly through the insert can pass through the openings to form an illuminated character. The lower end of the insert forms a switch actuator which can operate a switch when the top of the key, at the top wall of the shell, is depressed.

The keypad device can be constructed by first molding the shell and a pad portion which extends around the bottoms of the keys, in a first mold that is covered by a second mold. With the formed shell remaining in the first mold, a third mold is lowered onto the first mold. The third mold has a bottom wall defining the bottom of the key (the key bottom is lowermost only when the keyboard device is turned upside down to its use position). Light-transmitting material is established under pressure between the cavity formed by the shell in the first mold and the bottom of the second mold. This can be accomplished by laying a preform of the light-transmitting second material on a top surface of the third mold and using a fourth mold to press down the material of the preform to squeeze it through one or more sprue holes into the cavity formed within the shell that lies in the first mold.

The novel features of the invention are set forth with particularity in the appended claims. The invention will be best understood from the following description when read in conjunction with the accompanying drawings.

DESCRIPTION OF THE PREFERRED EMBODIMENT

Figure 1:
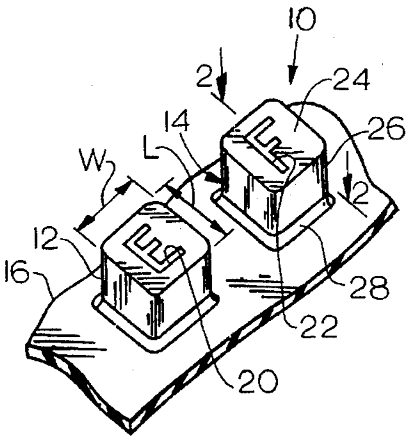
FIG. 1 is a partial isometric view of a keypad device constructed in accordance with the present invention.

FIG. 1 illustrates a keypad or keypad device 10 which includes key portions or keys 12, 14 and a pad portion or pad 16 that connects them and that can be mounted on a circuit board or the like. The particular keypad has "reverse graphics illumination" in that characters 20, 22 which represent the letters "E" and "F" are back lighted, or illuminated, while all of the surrounding area of the keypad is not back illuminated. Each key includes a key top 24 which normally bears the character, and key sides 26 that extend largely vertically from the key top to a flexible coupling portion 28 that connects to the pad 16. A person can use a finger to depress the key top 24 to operate a switch. It may be noted that while applicant uses terms such as "top", "bottom", "horizontal", etc. to aid in understanding the apparatus and method as illustrated herein, the keypad device can be used in any orientation with respect to gravity, and the fabricating apparatus can be used and the method performed in a variety of orientations with respect to gravity.

Figure 2:
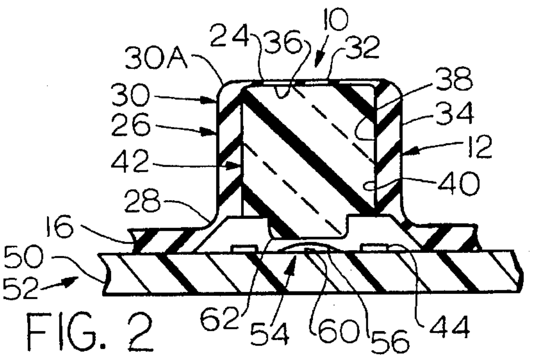
FIG. 2 is a sectional view taken on the line 2—2 of FIG. 1, with the keypad device shown mounted on a circuit board to result in a keyboard assembly.

As shown in FIG. 2, the keypad includes a shell 30 with a portion 30A at the key having top and side walls 32, 34. The lower surface 36 of the top wall and inner surface 38 of the side walls form a downwardly-opening cavity 40. An insert 42 lies within the cavity. While the shell 30, which forms the insert-holding cavity and which extends to the flexible portion 28 and pad portion 16, is formed of opaque material, the insert 42 is formed of light transmitting material. The light transmitting material is preferably translucent, although transparent material can be used. The light-transmitting insert 42 allows light to pass upwardly from a light source 44, through openings in the top wall 32 of the shell to create the illuminated characters.

The keypad 10 is generally mounted on a support board or circuit board 50. The combination of the keypad 10 and circuit board 50 may be referred to as a keyboard assembly 52. A switch 54 is mounted on the board 50. The switch includes a deflectable metal dome 56 whose center can be deflected downwardly until it touches a contact 60 mounted on the board, to complete a circuit. This type of switch is well known in the art. The insert 42 is formed with a lower part which forms a switch actuator 62 that downwardly deflects the dome 56 when the key top 24 is depressed. A variety of light sources are available, the particular light source 44 comprising a plurality of light emitting diodes mounted on the upper face of the circuit board.

Figure 3:
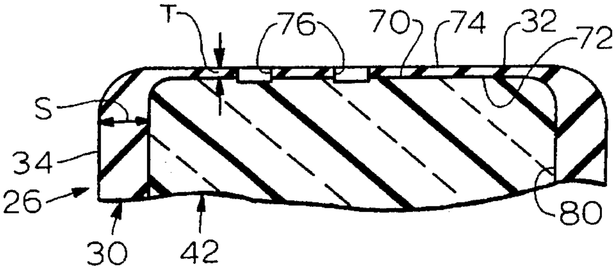
FIG. 3 is an enlarged view of the upper portion of a key of the keyboard assembly of FIG. 2.

FIG. 3 shows some details of the upper portion of the key 26 which includes the shell 30 and insert 42. The insert 42 has a top face 70 which supports the top wall 32 of the shell by lying facewise against the lower face or surface 72 of the shell top wall. The upper face or surface 74 of the shell top wall receives downward pressure by the finger of a person, which is transmitted through the insert. The character such as the letter "F" is formed by one or more openings 76 cut through the shell top wall 32, to allow light to pass upwardly from the insert through the openings.

The opening 76 can be accurately and neatly formed by applying heat to the shell top wall 32 at the area which is to form the opening. This can be accomplished by directing a laser beam at the top wall to evaporate shell material. It is preferable that the top wall 32 be very thin to facilitate such removal of material of the top wall to form the opening. Applicant forms the shell so the top wall 32 has a very small thickness T which results in the top wall being opaque to the passage of light and being sufficiently thick to avoid wearout during normal usage. A major limiting factor in determining how thin the wall can be, is manufacturing tolerances in the molding of the top wall. The side walls 34 of the shell are preferably considerably thicker than the top wall, especially immediately above where the bottom of the side wall merges with the flexible portion 28 (FIG. 2) that extends to the pad portion 16, to reliably support the key in an upright orientation over a long period of usage.

The insert 42 should be positioned with its top face 70 lying closely adjacent to the lower face 72 of the shell top wall. This is accomplished by molding the insert 42 into the cavity 40 formed during initial construction of the shell 30. Such molding results in precise facewise engagement of the insert with the walls of the cavity, especially at the top wall lower face 72. Such molding in place also facilitates bonding of the insert to the inside walls of the cavity formed by the shell. Applicant prefers to construct the insert 42 of elastomeric material, so that it deforms with pressure in the same manner as the walls of the shell 30, to avoid separation of the shell and insert during usage.

Figure 4:
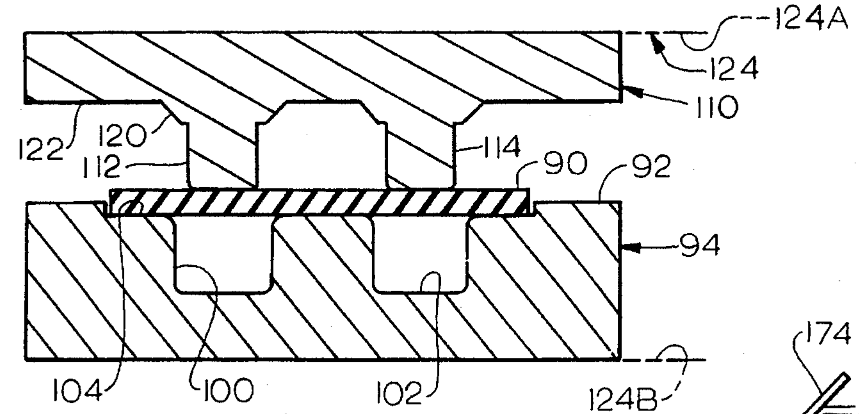
FIG. 4 is a sectional side view of keypad fabricating apparatus, and shows a step in the process of constructing the keypad device of FIG. 1.
Figure 5:
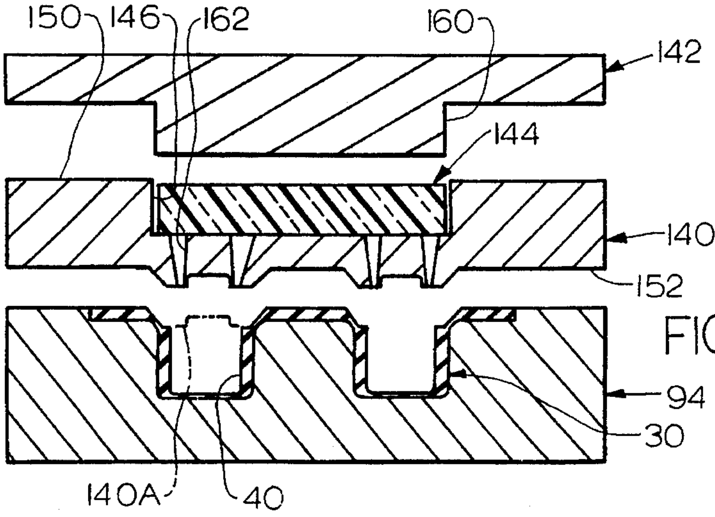
FIG. 5 is a sectional side view of additional keypad fabricating apparatus, and shows a later step in the construction of the keypad device of FIG. 1.
Figure 6:
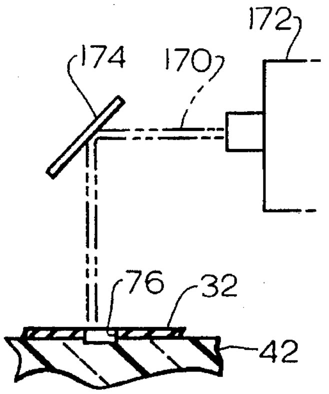
FIG. 6 is a side elevation view of a portion of the keypad device of FIG. 3, and shows a later step in the fabrication of the keypad device.

FIGS. 4–6 show steps during the fabrication of the keypad. In FIG. 4, applicant has laid a quantity of opaque elastomeric material in the form of a preform 90 on the upper surface 92 of a first mold 94. The first mold has cavities 100, 102 that form the outer surface of each key, and also has an upper surface portion 104 that forms the upper surface of the pad and of the flexible coupling portion that connects the pad to each key. A second mold 110 is placed above the first one, the second mold having protrusions 112,114 which define the shape of the cavity of each key. The second mold also has portions 120, 122 respectively defining the shape of the underside of the flexible coupling portion 28 and of the pad 16 of the keypad. The molds are placed in a heated press indicated at 124, which presses the molds together to deform the preform 90 into the shape shown at 30 in FIG. 5. The shell including the pad, shown at 30 in FIG. 5, is in an upside-down orientation with respect to the most common usage position shown in FIGS. 1–3.

The shell 30, which form the entire opaque elastomeric portion of the basic keypad, is left in the first mold 94. The second mold is removed, and a third and fourth mold 140, 142 are placed above the first mold, as shown in FIG. 5. A quantity of light-transparent second elastomeric material in the form of a second material preform 144 is laid in a recess 146 in the upper surface 150 of the third mold. The third mold has a lower surface 152 which, when closed over the first mold, defines the lower end of the actuator and the lower surface of the flexible coupling portion 28 and of the pad 16 of the final opaque elastomeric shell 30, although the entire shape of the shell has usually been already formed by the second mold.

With the third mold down against the first mold, as shown at 140A, pressure is applied to the second preform 144 by a protrusion 160 in the fourth mold, which fits fairly closely into the recess 146 in the upper surface of the third mold. With the fourth mold 142 being pushed down by the press, the protrusion 160 pressurizes the preform 144 and forces it through sprue holes 162 in the third mold to flow into the cavities 40 in the key portions of the shell 30. During such compression of the preform 144, some of the material will flow sidewardly between the third and fourth molds, but this does not harm the process. The third and fourth molds are then lifted and the almost finally formed keypad can be removed from the first mold.

A final step, shown in FIG. 6, is to direct a laser beam indicated at 170, from a laser 172 through a steerable mirror 174 at the shell top wall 32 to burn away a small area thereof to form the opening 76. It may be noted that a small thickness of the insert 42 also may be burned away, although this generally does not matter. The fact that the top wall 32 is thin, enables the laser removal of material to precisely form the opening. Also, the very shallow recess 76 is less likely to accumulate dirt. The fact that the preform and shell top wall 32 are bonded together, results in avoiding the entrance of oil or dirt between them. It is possible to eliminate the portion of the top wall that forms the opening during molding of the shell and/or filling the opening with the light transmitting second material, although this can be more difficult than removing material from the top wall after the molding process.

The length and width L, W (FIG. 1) of each key is generally at least about 0.5 centimeter. Applicant prefers to construct the shell top wall 32 (FIG. 3) with a thickness T between about 0.05 millimeter and 0.4 millimeter, the smaller limit of the range being provided to allow reasonable mold tolerances and the upper limit being provided to facilitate laser etching of the surface and to minimize dirt accumulation in the opening. It is possible to mold transparent material in the opening, although this adds an additional and somewhat difficult step. Applicant prefers to construct the side walls 34 of the shell with a thickness S that is more than twice the top wall thickness T, a typical thickness S being about 1.3 millimeters.

In the molding steps shown in FIGS. 4 and 5, applicant prefers to heat the top and bottom press plates 124A, 124B to heat the molds. The preform such as 90 is heated before it is placed on the mold and pressed into place, which helps to form it. After the preform has been formed into the shell shown at 30 in FIG. 5, it remains heated. The preform 144 of the second material is also heated by the third and fourth molds 140, 142 especially as the second material passes through the sprue holes 162. The elevated temperatures of both materials encourages them to bond together so the insert becomes firmly bonded to the inside walls of the shell.

It may be noted that elastomeric material is material which is readily deformed, such material having a Young's modulus of elasticity on the order of 3,000 psi or less, as compared to rigid engineering plastics which have a Young's modulus on the order of 300,000 psi.

Thus, the invention provides a keypad which enables light to pass through a character region formed in the key top, while blocking light substantially everywhere else, which is reliable and can be constructed at moderate cost. The keypad includes a shell formed of elastomeric opaque first material having a downwardly-facing cavity, and a light-transmitting insert lying in the cavity and supporting the key top. The insert preferably has a lower portion forming a switch actuator. The top wall of the shell has a cutaway portion or opening forming a character. The top wall is preferably thin, and is supported by the insert which preferably adheres or bonds to the top wall and preferably the rest of the cavity walls. This can be accomplished by molding the insert material into the cavity. The translucent insert material is preferably elastomeric, to avoid breaking the bond between it and the shell walls. The keypad device can be formed by first molding the shell of the first material, and then injecting the second material into the cavity formed by the shell. A laser or other device then can remove an area at the top wall of the opaque shell to leave the light-passing region that forms a character. It may be noted that it is possible for a character to be formed on a side wall of the shell, by using a laser or other means to cut away part of the shell thereat, any such opening in the sidewall being the equivalent of an opening in the top wall of the shell.

Although particular embodiments of the invention have been described and illustrated herein, it is recognized that modifications and variations may readily occur to those skilled in the art, and consequently, it is intended that the claims be interpreted to cover such modifications and equivalents.

We claim:

1. A method for forming a keypad characterized by:

forming a keypad shell primarily of elastomeric opaque first material which includes integrally molding at least a first key wherein said first key has a first key top that has a first opening therein and that has a lower face with said first key further having first key sides extending primarily vertically from said first key top and forming a first cavity within said first key sides and said first key top, and with said first key further having a first pad extending primarily horizontally from a location near the bottom of said first key sides, so said first key top, first key sides, and first pad are integral with each other, with said first key top further having an upper face; and installing a quantity of light transmitting second material in said first cavity with said quantity of second material having a top face lying facewise against the lower face of said first key top to support it;

said step of forming a keypad shell including forming said keypad shell so it is devoid of said opaque first material at selected regions of said first key top to leave said first opening therein, and with said first opening representing a character.

2. The method described in claim 1 wherein:

said step of forming further includes forming said first key top so it has a thickness less than half the average thickness of said first key sides.

3. The method described in claim 1 wherein:

said first key top and said first key sides form walls of said first cavity; and said step of installing said quantity of second material includes flowing it into said first cavity to mold and adhere said second material precisely to the walls of said first cavity, said light transmitting second material being elastomeric to thereby resist its separation from said cavity walls of said first cavity when said shell is deformed.

4. The method described in claim 1 wherein:

said step of forming a keypad shell further includes laying a sheet of said elastomeric opaque first material on a first mold which has a mold cavity defining the outer surface of said shell, and pressing a second mold against said sheet and into said first mold, with said second mold having a protrusion forming the shape of said first cavity, to thereby form said keypad shell, and then separating said molds and leaving said keypad shell in said first mold;

laying a quantity of said light transmitting second material on the upper surface of a third mold whose lower surface defines the lower surface of the combination of said shell with said quantity of second material therein in the finished keypad, and which has at least one sprue hole coupling its upper and lower surfaces; and with said third mold clamped against said first mold, and with said keypad shell having been formed, forcing said second material through said at least one sprue hole into the space between said keypad shell lying in said first mold and said third mold lower surface, to produce said keypad shell with said quantity of second material installed therein.

5. A keypad which includes a pad portion for mounting on a circuit board, characterized by:

a shell that includes a key portion having a top wall with a lower surface and having side walls with lower ends and with inner surfaces, said key portion walls forming a downwardly opening cavity, and said shell having flexible coupling portions that connect said side lower ends to said pad portion;

a quantity of a light transmitting material lying in said cavity, said quantity of light transmitting material having a top face which lies substantially against said lower surface of said shell top wall;

said shell top wall having at least a first opening therein representing a character, with said first opening being at least translucent to light that has passed through said quantity of light transmitting material; and said top wall, side walls, flexible coupling portions, and pad portion being integral and formed of an opaque elastomeric material, with substantially the entire thickness of said pad portion being of said opaque elastomeric material.

6. The keypad described in claim 5 wherein:

said pad portion is formed solely of said opaque elastomeric material and is devoid of connection to said quantity of light transmitting material except through said coupling portions, said side walls, and said top wall; and said quantity of light transmitting material has an outer surface which adheres to said shell wall surfaces which form said cavity, and said light transmitting material is an elastomeric material, to thereby avoid breaking said adherence.

7. The keypad described in claim 5 wherein:

said opaque elastomeric material of said shell and said light transmitting material are each formed of molded and solidified elastomeric material.

8. The keypad described in claim 5 wherein:

said circuit board comprises a quantity of substantially rigid material which has a substantially flat upper face portion, and a switch on said board, said keypad being mounted on said board upper face portion, with said quantity of light transmitting material having a lower portion forming a switch actuator lying substantially against said switch to operate it when said top wall is depressed; and a light source coupled to said board to direct light up through said quantity of light transmitting material, to pass through said shell top wall first opening.

9. A backlit keyboard assembly comprising:

a board assembly which includes a board, a plurality of switches on said board, and a light source positioned to illuminate a region immediately above said board;

a keypad of opaque elastomeric material which includes a pad portion lying on said board and a plurality of spaced key portions each lying over a corresponding one of said switches, each of said key portions having a top wall;

each of said key portions further including side walls, with said top and side walls forming a downwardly opening cavity, and with said top and side walls of each key portion being integral with said pad portion, and including a plurality of separate quantities of light transmitting second material each lying in a corresponding one of said cavities with each quantity of second material having a lower end forming a switch operator which transmits force to operate a corresponding one of said switches when the top wall of a corresponding key portion is depressed, and with the lower end of each quantity of second material positioned to be illuminated by said light source to pass light upwardly through the corresponding quantity of light transmitting material; and said top wall of each of a plurality of said key portions having a cutaway region defining a character, for transmitting light passing up through the corresponding quantity of second material;

said plurality of quantities of second material are separate from one another;

said pad portion connecting said key portions, with said pad portion and said key portions being formed of opaque elastomeric material.

10. A method for forming a keypad characterized by:

forming a keypad shell of elastomeric opaque first material which includes at least a first key with a first key top and first key sides extending largely vertically from said first key top and forming a first cavity within said first key sides and first top, and with a pad extending largely horizontally from near the bottom of said first key sides, said first key top having upper and lower faces;

installing a quantity of light transmitting second material in said first cavity wherein said quantity of second material has a top face, so said top face lies facewise against the lower face of said first key top to support it; and removing selected regions of said first key top to leave an opening therein representing a character, with said opening being translucent so it can pass light that has passed up through said quantity of second material.

* * * * *